US012610718B2

(12) United States Patent
Han et al.

(10) Patent No.: US 12,610,718 B2
(45) Date of Patent: Apr. 21, 2026

(54) DISPLAY DEVICE WITH INTEGRATED TOUCH SCREEN

(71) Applicant: LG Display Co., Ltd., Seoul (KR)

(72) Inventors: Jonghyun Han, Paju-si (KR);
GuanYoung Son, Paju-si (KR);
SangHyeon Seon, Paju-si (KR);
Younggyu Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 475 days.

(21) Appl. No.: 18/359,468

(22) Filed: Jul. 26, 2023

(65) Prior Publication Data

US 2024/0260399 A1 Aug. 1, 2024

(30) Foreign Application Priority Data

Jan. 31, 2023 (KR) ........................ 10-2023-0013247

(51) Int. Cl.
| | |
|---|---|
| *H10K 59/80* | (2023.01) |
| *G06F 3/041* | (2006.01) |
| *G06F 3/044* | (2006.01) |
| *H10K 59/12* | (2023.01) |
| *H10K 59/40* | (2023.01) |

(52) U.S. Cl.
CPC ......... *H10K 59/873* (2023.02); *G06F 3/0412* (2013.01); *G06F 3/0443* (2019.05); *G06F 3/0446* (2019.05); *H10K 59/40* (2023.02); *H10K 59/12* (2023.02)

(58) Field of Classification Search
CPC ...... H10K 59/873; H10K 59/40; H10K 59/12; G06F 2203/04103
See application file for complete search history.

(56) References Cited

U.S. PATENT DOCUMENTS

| | | | |
|---|---|---|---|
| 10,497,760 B2 | 12/2019 | Yeo | |
| 2019/0198582 A1 | 6/2019 | Yeo | |
| 2021/0119177 A1* | 4/2021 | Bang | ..................... G06F 3/0412 |

FOREIGN PATENT DOCUMENTS

KR 10-2019-0078746 A 7/2019

* cited by examiner

*Primary Examiner* — Chad M Dicke
*Assistant Examiner* — Dave Tan
(74) *Attorney, Agent, or Firm* — Fenwick & West LLP

(57) ABSTRACT
Disclosed is a display device with integrated touch screen comprising a substrate, a first insulating layer provided on the substrate, a second insulating layer provided on the first insulating layer, a dam provided on the second insulating layer, a layer protection part provided outside the dam, and a touch insulating layer provided on the encapsulation layer.

20 Claims, 9 Drawing Sheets

DISPLAY DEVICE WITH INTEGRATED TOUCH SCREEN

CROSS-REFERENCE TO RELATED APPLICATION

This application claims the benefit of the Republic of Korea Patent Application No. 10-2023-0013247 filed on Jan. 31, 2023, which is hereby incorporated by reference in its entirety.

BACKGROUND

Technical Field

The present disclosure relates to a display device integrated touch screen.

Description of the Related Art

As the information society develops, demands for display devices for displaying images are increasing in various forms. As a result, various displays such as liquid crystal display (LCD), plasma display panel (PDP), and organic light emitting display (OLED) have recently been used. Among them, the organic light emitting display OLED device is capable of driving low voltage, is thin, has an excellent viewing angle, and has a high response speed.

Recently, the organic light emitting display device is formed as a display device integrated touch screen including a touch screen panel capable of recognizing a user's touch. In this case, the organic light emitting display device also functions as a touch screen device. Recently, touch screen devices have been applied to monitors such as navigation, industrial terminals, laptops, financial automation devices, and game consoles, portable terminals such as smartphones, tablets, mobile phones, MP3, PDA, PMP, PSP, portable game machines, DMB receivers, tablet PCs, and other home appliances such as refrigerator, microwave, washing machine. In addition, the application of touch screen devices is gradually expanding due to the advantage that anyone can easily operate.

In the display device integrated touch screen, touch electrodes are formed in the display panel. The touch electrode is formed on a touch insulating layer, and when the touch insulating layer is formed of an organic layer, the thickness of the touch insulating layer increases compared to that of the inorganic layer. When the touch insulating layer is formed of an organic layer, the thickness of the touch insulating layer increases compared to that formed of an inorganic layer. In this case, due to the difference in thickness of the touch insulating layer formed of the organic film, a photoresist is formed to have a thickness greater than that designed on the outer periphery of the non-display area in the patterning process for forming the touch electrode.

In this case, a portion of the photoresist formed to a thickness larger than the designed thickness is not cured during lithography process and remains on the substrate in the form of a residual film, which eventually leaves a residual film of the touch electrode in the part where residual film of the photoresist is formed.

When the residual film of the touch electrode is formed, the thin film transistor substrate may be affected by electro static discharge (ESD) entering thin film transistor substrate. When the residual film of the photoresist is formed, a portion of the residual film of the photoresist formed of an organic material may be scattered during a trimming process thereby increasing a defect rate of a thin film transistor substrate.

SUMMARY

The present disclosure has been made in view of the above problems, and it is an object of the present disclosure to provide a display device integrated touch screen that does not leave a residual film of a photoresist or a touch electrode between the non-display area and the trimming line by providing a step adjustment layer at one side of the layer protection part outside the non-display area.

In one embodiment, a display device with integrated touch screen comprises: a substrate; a first insulating layer on the substrate; a second insulating layer on the first insulating layer; a dam on the second insulating layer; a layer protection part overlapping an end of the second insulating layer and non-overlapping with the dam; an encapsulation layer on the second insulating layer; a touch electrode and a touch insulating layer on the encapsulation layer; and a step adjustment layer at one side of the layer protection part without the layer protection part between the step adjustment layer and the substrate.

In one embodiment, a display device with integrated touch screen comprises: a substrate including a display area and a non-display area, the non-display area including a layer end area that includes an end of the substrate; a plurality of pixels and a plurality of touch electrodes in the display area; a touch line and a touch pad electrode in the non-display area, the touch line and the touch pad electrode electrically connected to the plurality of touch electrodes; and a step adjustment layer in a portion of the layer end area, wherein the portion of the layer end area including the step adjustment layer is thicker than remaining portions of the layer end area.

In one embodiment, a touch display device comprises: a substrate including a display area and a non-display area, the non-display area including a layer end area that includes an end of the substrate; a plurality of pixels and a plurality of touch electrodes on the display area; a plurality of insulating layers that extend from the display area to the non-display area without extending to the layer end area; a layer protection part covering side surfaces of the plurality of insulating layers in the non-display area, the layer protection part including an upper surface having a first height with respect to the substrate; and a step adjustment layer in a portion of the layer end area, an upper surface of the step adjustment layer having a second height with respect to the substrate that is less than the first height of the layer protection part.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
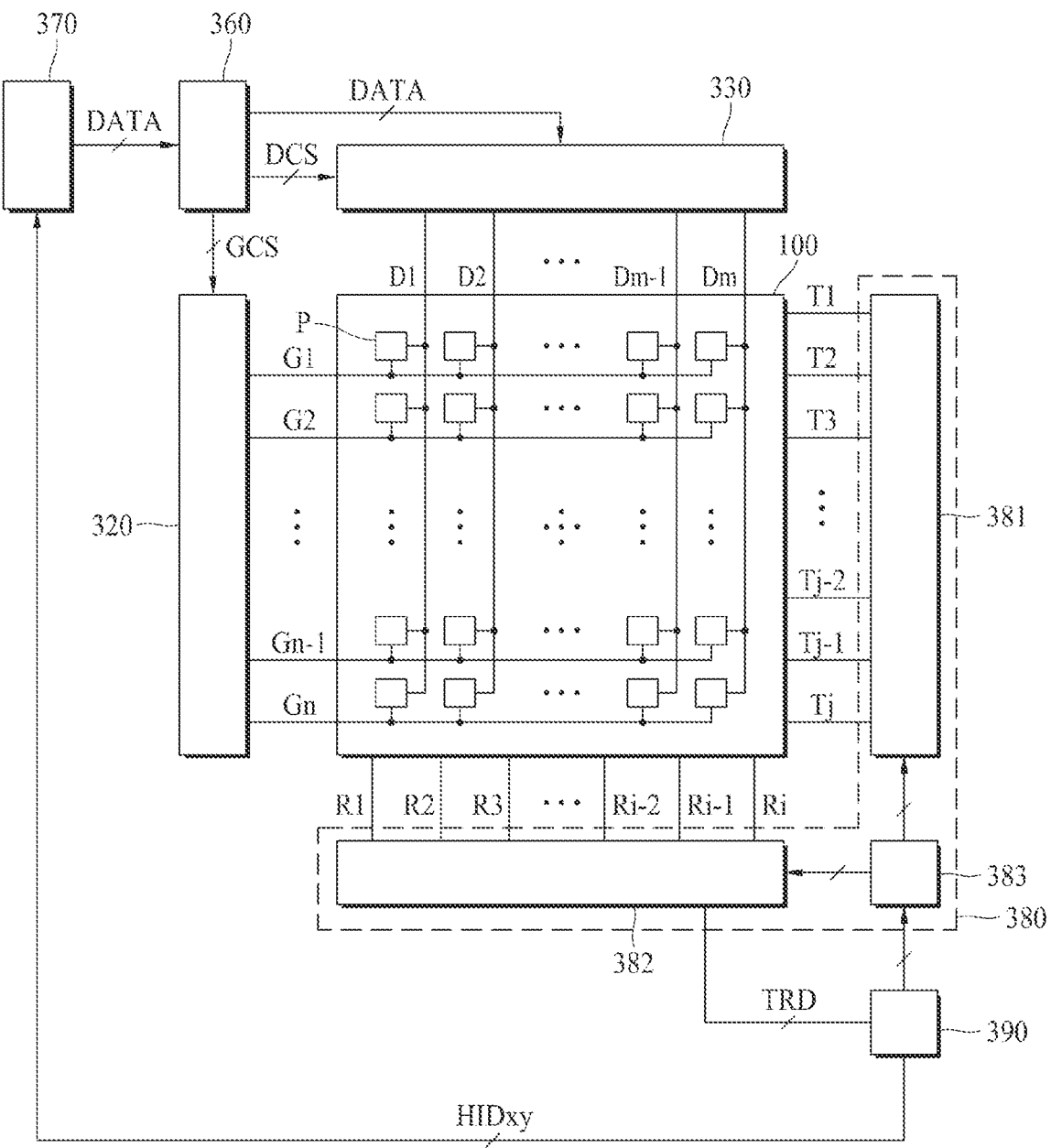
FIG. 1 is a block diagram illustrating a display device integrated touch screen according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent,"

"next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a block diagram illustrating a display device integrated touch screen according to an embodiment of the present disclosure.

Referring to FIG. 1, a display device integrated touch screen according to an embodiment of the present disclosure includes a display panel 100, a gate driver 320, a data driver 330, a timing controller 360, a host system 370, a touch driver 380, and a touch coordinate calculation unit 390 (e.g., a circuit).

The display device integrated touch screen according to an embodiment of present disclosure may be implemented as a liquid crystal display LCD, a field emission display FED, a plasma display panel PDP, an organic light emitting display OLED, an electrophoresis display EPD, etc. In the following embodiment, a display device integrated touch screen according to an embodiment of the present disclosure will be mainly described as an organic light emitting display device, but it should be noted that the present disclosure is not limited thereto.

The display panel 100 includes a display area in which pixels P are provided to display an image. Data lines D1 to Dm, where m is a positive integer of 2 or more and gate lines G1 to Gn, where n is a positive integer of 2 or more are formed on the display panel 100. The data lines D1 to Dm may be formed to cross the gate lines G1 to Gn. The pixels P may be formed in a region defined by an intersection structure between the gate lines G1 to Gn and the data lines D1 to Dm.

Each of the pixels P of the display panel 100 may be connected to any one of the data lines D1 to Dm and any one of the gate lines G1 to Gn. Each of the pixels P of the display panel 100 may include a driving transistor that adjusts a drain-source current according to a data voltage applied to the gate electrode, a switching transistor that is turned on by a gate signal of the gate line and supplies a data voltage of a data line to the gate electrode of the driving transistor, an organic light emitting diode that emits light according to the drain-source current of the driving transistor, and a capacitor for storing the voltage of the gate electrode of the driving transistor. Therefore, each of the pixels P may emit light according to the current supplied to the organic light emitting diode.

The gate driver 320 receives a gate control signal GCS from the timing controller 360. The gate driver 320 supplies gate signals to the gate lines G1 to Gn according to the gate control signal GCS.

The gate driver 320 may be formed in a non-display area outside one or both sides of the display area of the display panel 100 in a gate driver in panel GIP manner. Alternatively, the gate driver 320 may be made of a driving chip, mounted on a flexible film, and attached to a non-display area outside one or both sides of the display area of the display panel 100 by tape automated bonding TAB manner.

The data driver 330 receives the digital video data DATA and the data control signal DCS from the timing controller 360. The data driver 330 converts the digital video data DATA into an analog positive/negative data voltage according to the data control signal DCS and supplies the converted data voltage to the data lines. That is, pixels to which data voltages are to be supplied are selected by gate signals of the gate driver 320, and data voltages are supplied to the selected pixels.

The data driver 330 may include a plurality of source drive ICs. Each of the plurality of source drive ICs may be mounted on a flexible film in a chip on film COF or chip on plastic COP manner. The flexible film is attached to pads provided on the non-display area of the display panel 100 using an anisotropic conducting film, thereby connecting a plurality of source drive ICs to the pads.

The timing controller 360 receives digital video data DATA and timing signals from the host system 370. The timing signals may include a vertical synchronization signal, a horizontal synchronization signal, a data enable signal, a dot clock, and the like. The vertical synchronization signal is a signal defining one frame period. The horizontal synchronization signal is a signal defining one horizontal period required to supply data voltages to pixels of one horizontal line of the display panel 100. The data enable signal is a signal defining a period in which valid data is input. The dot clock is a signal repeated in a predetermined short period.

The timing controller 360 generates a data control signal DCS for controlling the operation timing of the data driver 330 and a gate control signal GCS for controlling the operation timing of the gate driver 320 based on the timing signals. The timing controller 360 outputs the gate control signal GCS to the gate driver 320 and outputs the digital video data DATA and the data control signal DCS to the data driver 330.

The host system 370 may be implemented as a navigation system, a set-top box, a DVD player, a Blu-ray player, a personal computer PC, a home theater system, a broadcast receiver, a phone system, or the like. The host system 370 converts the digital video data DATA of the input image into a format suitable for displaying on the display panel 100, including a system on chip SoC with a built-in scaler. The host system 370 transmits digital video data DATA and timing signals to the timing controller 360.

First and second touch electrodes may be formed on the display panel 100 in addition to the data lines D1 to Dm and the gate lines G1 to Gn. The first touch electrodes may be formed to cross the second touch electrodes. The first touch electrodes may be connected to the first touch driver 381 through first touch lines T1 to Tj, j is a positive integer of 2 or more. The second touch electrodes may be connected to the second touch driver 382 through second touch lines R1 to Ri, i is a positive integer of 2 or more. A touch sensor may be formed in each of the intersections of the first touch electrodes and the second touch electrodes. In an embodiment of present disclosure, it is illustrated that the touch sensor is implemented with mutual capacitance, but it should be noted that the touch sensor is not limited thereto.

The touch driver 380 supplies a driving pulse to the first touch electrodes through the first touch lines T1 to Tj and senses a charge variation amount of each of the touch sensors through the second touch lines R1 to Ri. That is, in FIG. 1, the first touch lines T1 to Tj are Tx lines for supplying driving pulses, and the second touch lines R1 to Ri are Rx lines for sensing charge variation of each of the touch sensors.

The touch driver 380 includes a first touch driver 381, a second touch driver 382, and a touch controller 383 (e.g., a circuit). The first touch driver 381, the second touch driver 382, and the touch controller 383 may be integrated in one Read-out integrated circuit (ROIC).

The first touch driver 381 selects a first touch line to output a driving pulse under the control of the touch controller 383, and supplies the driving pulse to the selected first touch line. For example, the first touch driver 381 may sequentially supply driving pulses to the first touch lines T1 to Tj.

The second touch driver 382 selects second touch lines to receive charge variations of touch sensors under the control of the touch controller 383, and receives charge variations of touch sensors through the selected second touch lines. The second touch driver 382 samples charge variations of touch sensors received through the second touch lines R1 to Ri and converts them into touch raw data TRD, which is digital data.

The touch controller 383 may generate a Tx setup signal for setting a first touch line to which a driving pulse will be output from the first touch driver 381 and an Rx setup signal for setting a second touch line to receive a touch sensor voltage from the second touch driver 382. In addition, the touch controller 383 generates timing control signals for controlling the operation timing of the first touch driver 381 and the second touch driver 382.

The touch coordinate calculation unit 390 receives touch row data TRD from the touch driver 380. The touch coordinate calculation unit 390 calculates the touch coordinates according to the touch coordinate calculation method and outputs touch coordinate data HIDxy including information of the touch coordinates to the host system 370.

The touch coordinate calculation unit 390 may be implemented as a micro controller unit MCU. The host system 370 analyzes touch coordinate data HIDxy input from the touch coordinate calculation unit 390 and executes an application program associated with the coordinates in which the touch is generated by the user. The host system 370 transmits digital video data DATA and timing signals to the timing controller 360 according to the executed application program.

The touch driver 380 may be included in the source drive ICs or may be manufactured as a separate driving chip and mounted on the circuit board. In addition, the touch coordinate calculation unit 390 may be made of a driving chip and mounted on a circuit board.

Figure 2:
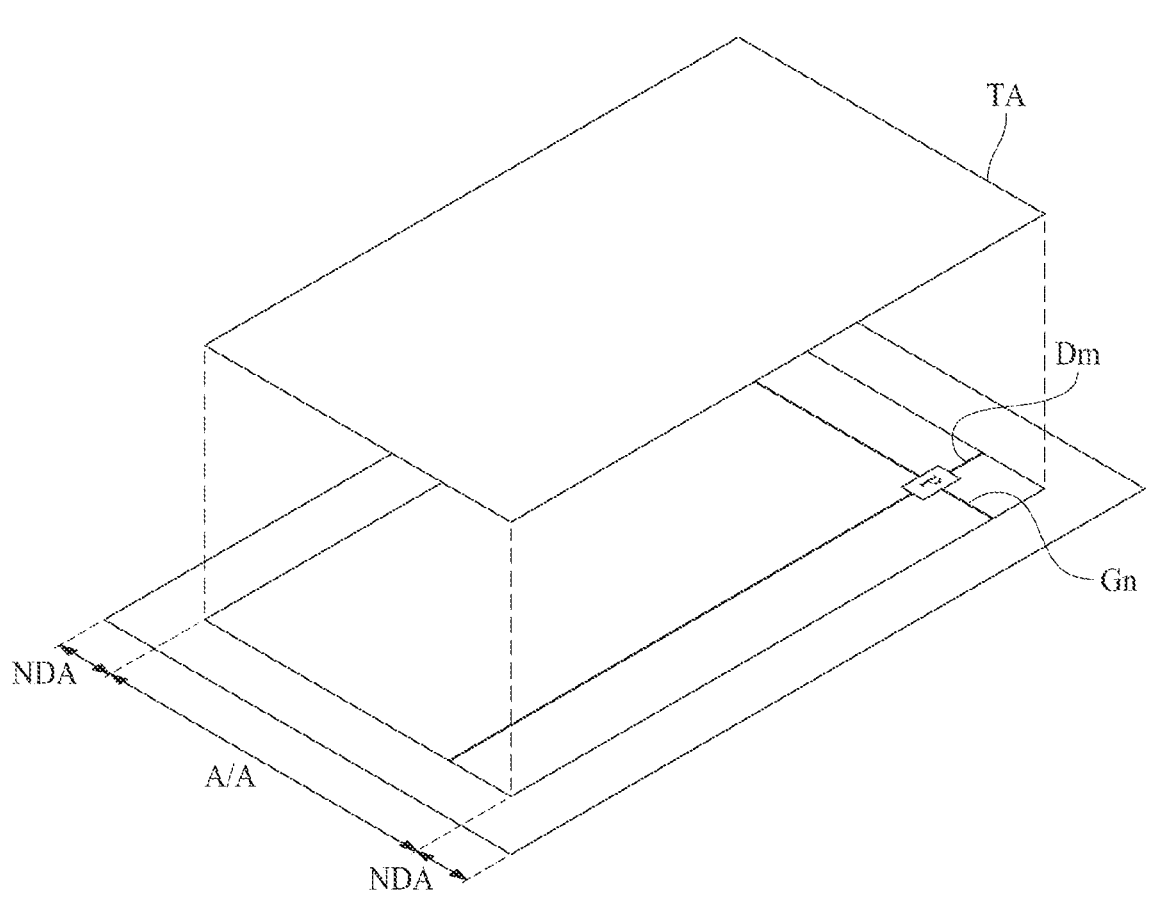
FIG. 2 is a schematic view illustrating a display panel and a touch area of a display device integrated touch screen according to an embodiment of the present disclosure.

FIG. 2 is a schematic diagram schematically illustrating a display area and a touch area of a display device integrated touch screen according to an embodiment of the present disclosure.

In accordance with an embodiment of present disclosure, the display device integrated touch screen includes a display area A/A, a non-display area NDA, and a touch area TA.

The display area A/A is an area including a plurality of pixels P, and may be defined by the plurality of pixels P formed by crossing a plurality of gate lines G1 to Gn and a plurality of data lines D1 to Dm.

The non-display area NDA is provided outside the display area A/A (e.g., around the display area A/A), and may not visually display image information as an area in which the plurality of pixels P do not exist. The non-display area NDA may include a driving device such as the gate driver and the data driver. Furthermore, the non-display area NDA may include a touch driver connecting a plurality of touch electrodes provided in the touch area TA.

The touch area TA may be provided on the display area A/A and may correspond to the display area A/A. Although not illustrated, the display device integrated touch screen according to an embodiment of present disclosure may be implemented as an in-cell type display device integrated touch screen by providing an encapsulation layer between the display area A/A and the touch area TA.

The touch area TA may be provided by a plurality of first touch electrodes and a plurality of second touch electrodes crossing each other, and the touch area TA may serve as a touch sensor by a mutual capacitance manner formed between the plurality of first touch electrodes and the plurality of second touch electrodes. However, present disclosure is not limited thereto, and another embodiment of present disclosure may serve as a touch sensor by a self-capacitance manner by a plurality of touch electrodes.

Figure 3:
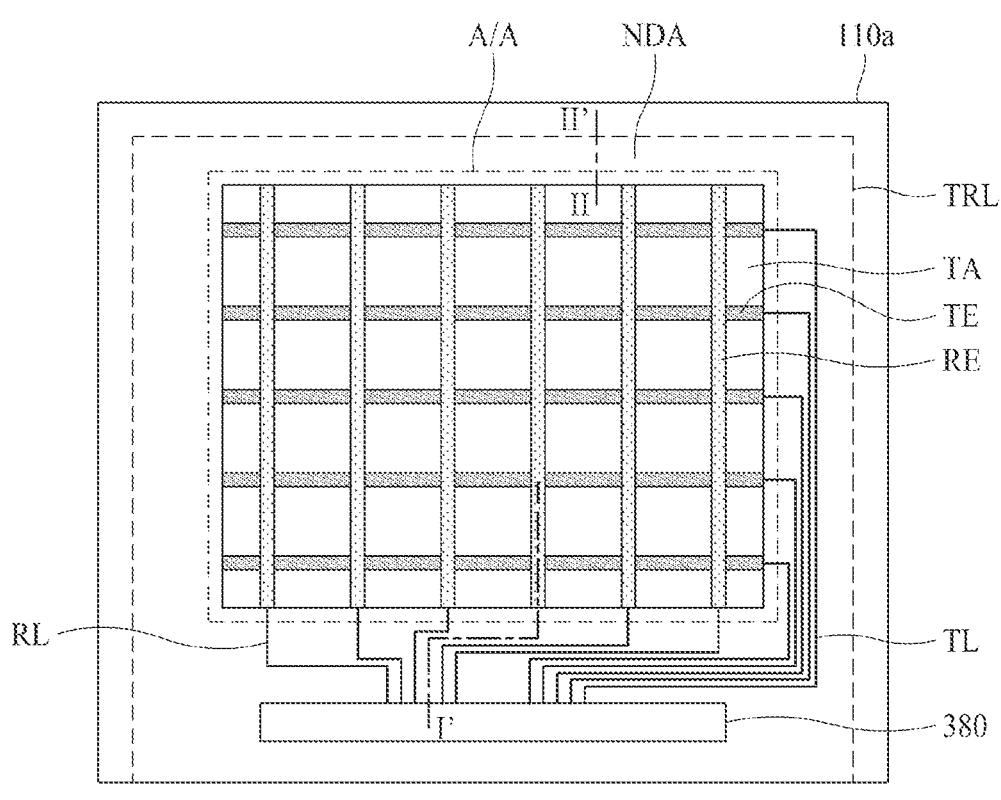
FIG. 3 is a plan view of a display device integrated touch screen according to an embodiment of the present disclosure.

FIG. 3 is a plan view illustrating a touch area of a display device integrated touch screen according to an embodiment of the present disclosure.

According to an embodiment of the present disclosure, as shown in FIG. 3, a display device integrated touch screen includes a substrate 110*a*, a display area A/A, a touch area TA, a plurality of first touch electrodes TE and a plurality of second touch electrodes RE provided in the touch area TA, a first touch line TL, a second touch line RL, a touch driver 380 and a trimming line TRL.

The substrate 110*a* corresponds to a substrate before a trimming process is performed.

The substrate 110*a* may be made of glass or plastic. In particular, the substrate 110*a* may be made of transparent plastic having flexible properties, for example, polyimide. When the polyimide is used as the substrate 110*a*, considering that a high-temperature deposition process is performed on the substrate 110*a*, a heat-resistant polyimide capable of enduring a high temperature may be used.

The touch area TA may be formed on the display area A/A. The touch area TA may include a plurality of the first touch electrodes TE extending to the first direction, for example, a horizontal direction, and a plurality of second touch electrodes RE extending to the second direction, for example, a vertical direction.

Each of the plurality of first touch electrodes TE may be connected to a plurality of first touch lines TL at one side to be electrically connected to the touch driver 380. According to an embodiment of the present disclosure, the plurality of first touch lines TL may be connected to the first touch electrode TE and may extend on the non-display area NDA to be connected to the touch driver 380 provided at the bottom of the drawing of the substrate 110*a*.

Each of the plurality of second touch electrodes RE may be connected to a plurality of second touch lines RL at one side to be electrically connected to the touch driver 380. According to an embodiment of the present disclosure, the plurality of second touch lines RL may be connected to the second touch electrode RE and may extend on the non-display area NDA to be connected to the touch driver 380 provided at the bottom of the drawing of the substrate 110*a*.

The trimming line TRL may be located outside the non-display area NDA, and may be formed on the upper, left, and right sides of the drawing on the substrate 110*a*. The trimming line TRL corresponds to a portion that is cut using a laser in a trimming process. In one embodiment, the trimming line TRL corresponds to the end of the substrate 110 resulting from the cut using the laser. Therefore, after the trimming process is performed along the trimming line TRL, the final product may include the substrate 110 cut along the trimming line TRL, a plurality of thin film transistors, pixels P, and a plurality of touch electrodes TE and RE provided on the cut substrate 110.

Figure 4:
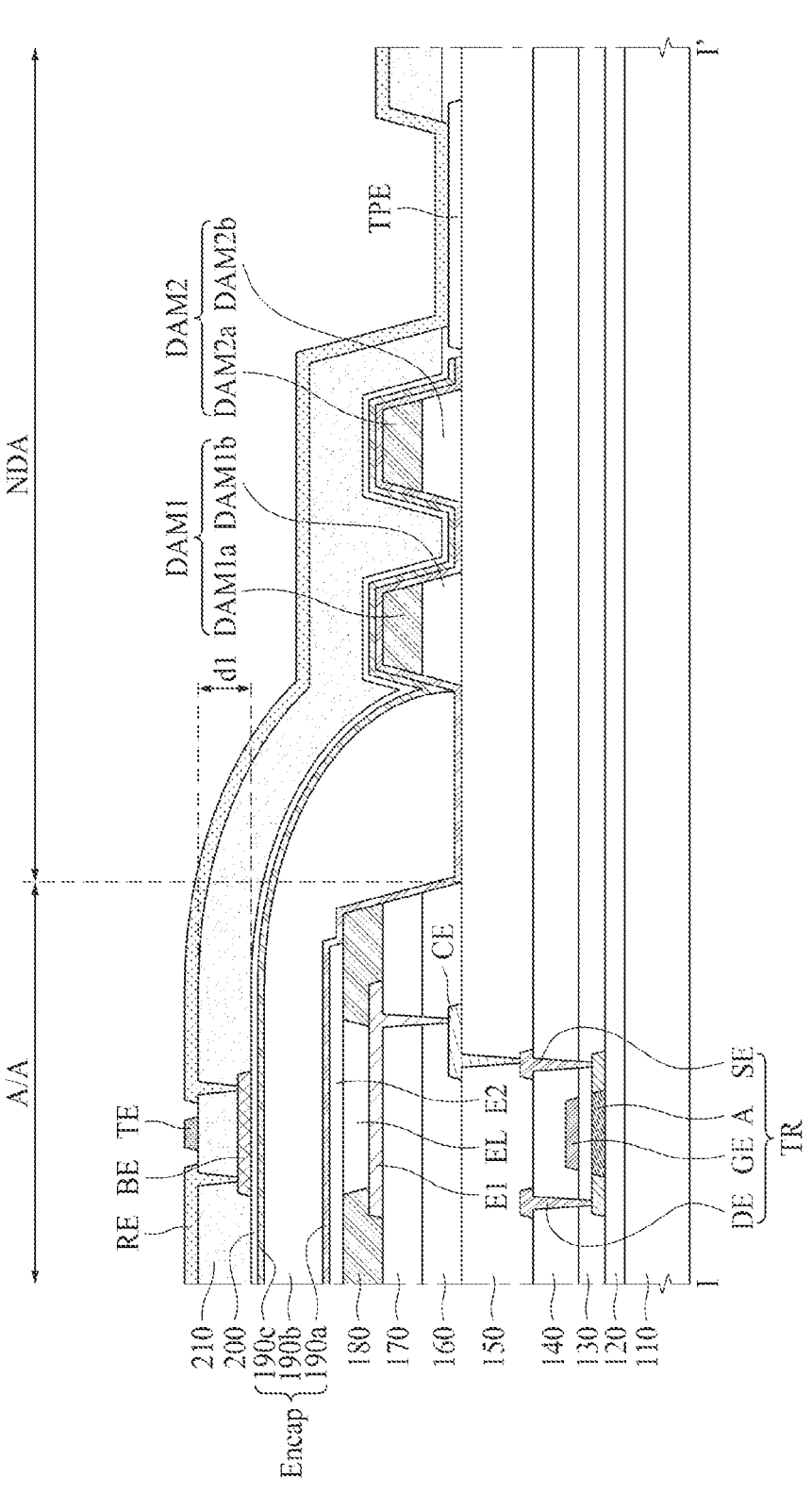
FIG. 4 is a cross-sectional view along I-I' of a display device integrated touch screen shown in FIG. 3 according to an embodiment of the present disclosure.

FIG. 4 is a cross-sectional view along line I-I' of a display device integrated touch screen shown in FIG. 3 according to an embodiment of the present disclosure.

As shown in FIG. 4, according to an embodiment of present disclosure, a display device integrated touch screen includes a substrate 110, a buffer layer 120, an active layer A, a gate insulating layer 130, a gate electrode GE, a first interlayer insulating layer 140, a source/drain electrode SE/DE, a second interlayer insulating layer 150, a first planarization layer 160, a second planarization layer 170, a bank layer 180, a first electrode E1, a light emitting layer EL, a second electrode E2, an encapsulation layer Encap, a touch buffer layer 200, a touch insulating layer 210, a bridge electrode BE, a first touch electrode TE, a second touch electrode RE, a first dam DAM1, a second dam DAM2, and a touch pad electrode TPE.

The substrate 110 may be made of glass or plastic. In particular, the substrate 110 may be made of transparent plastic having flexible properties, for example, polyimide. When polyimide is used as the substrate 110, considering that a high-temperature deposition process is performed on the substrate 110, a heat-resistant polyimide capable of enduring high temperatures may be used. Although not shown in the drawings, the substrate 110 may include a plurality of substrates such as a first substrate and a second substrate.

The buffer layer 120 is formed on the substrate 110. The buffer layer 120 may protect an active layer A by blocking air and moisture. The buffer layer 120 may be formed of an inorganic insulating material such as silicon oxide, silicon nitride, or metal oxide, but is not limited thereto and may be formed of an organic insulating material. The buffer layer 120 may be formed of a single layer or a plurality of layers.

The thin film transistor TR may be formed on the substrate 110 or the buffer layer 120. The thin film transistor TR may include an active layer A, a gate electrode GE, a source electrode SE, and a drain electrode DE, and the thin film transistor TR shown in FIG. 4 may be a driving thin film transistor.

Meanwhile, the thin film transistor TR according to an embodiment of present disclosure illustrates only a top gate structure in which the gate electrode GE is provided above the active layer A, but is not limited thereto, the thin film transistor TR may have a bottom gate structure in which the gate electrode GE is provided below the active layer A, and furthermore, the thin film transistor TR may have a double structure in which the gate electrode GE is provided above and below the active layer A.

The active layer A may be formed on the substrate 110 or the buffer layer 120. The active layer A may be formed of a silicon-based Si semiconductor material or an oxide-based semiconductor material. A light blocking layer for blocking external light incident on the active layer A may be additionally formed between the buffer layer 120 and the active layer A.

The gate insulating layer 130 may be formed on the active layer A.

The gate insulating layer 130 may include a silicon nitride layer SiNx or a silicon oxide layer SiOx, but is not limited thereto. The gate insulating layer 130 may have a single layer structure or a multilayer layer structure.

The gate electrode GE may be formed on the gate insulating layer 130.

The gate electrode GE may include at least one of an aluminum-based metal such as aluminum Al or an aluminum alloy, a silver-based metal such as silver Ag or silver alloy, a copper-based metal such as copper Cu or copper alloy, a molybdenum-based metal such as molybdenum Mo or molybdenum alloy, chromium Cr, tantalum Ta, neodymium Nd, and titanium Ti. The gate electrode GE may have a multilayer structure including at least two different conductor layers.

The first interlayer insulating layer 140 is formed on the gate electrode GE.

The first interlayer insulating layer 140 insulates the gate electrode GE from the source electrode SE and further insulates the gate electrode GE from the drain electrode DE. The first interlayer insulating layer 140 may include a single layer or a plurality of layers including an inorganic insulating material and/or an organic insulating material.

The first interlayer insulating layer 140 is provided with a contact hole. Accordingly, one side, for example, a left side, of the active layer A may be exposed by the contact hole, and the other side, for example, a right side, of the active layer A may be exposed by the contact hole.

The source electrode SE and the drain electrode DE may be formed on the first interlayer insulating layer 140.

The source electrode SE is electrically connected to one side of the active layer A, and the drain electrode DE is electrically connected to the other side of the active layer A.

Specifically, the source electrode SE is connected to one side of the active layer A through the contact hole provided in the first interlayer insulating layer 140, and the drain electrode DE is connected to the other side of the active layer A through the contact hole provided in the first interlayer insulating layer 140.

A second interlayer insulating layer 150 is provided on the source electrode SE and the drain electrode DE.

The second interlayer insulating layer 150 may include a single layer or a plurality of layers including an inorganic insulating material and/or an organic insulating material.

The second interlayer insulating layer 150 is provided with a contact hole. Accordingly, the source electrode SE may be exposed by the contact hole.

An auxiliary electrode CE may be formed on the second interlayer insulating layer 150.

The auxiliary electrode CE is electrically connected to the source electrode SE through a contact hole provided on the second interlayer insulating layer 150. Although not shown in the drawing, the auxiliary electrode CE may be connected to the capacitor electrode.

The auxiliary electrode CE may include at least one of an aluminum-based metal such as aluminum Al or an aluminum alloy, a silver-based metal such as silver Ag or silver alloy, a copper-based metal such as copper Cu or copper alloy, a molybdenum-based metal such as molybdenum Mo or molybdenum alloy, chromium Cr, tantalum Ta, neodymium Nd, and titanium Ti. The gate electrode GE may be formed of a single layer or a multilayer including two or more conductor layers having different physical properties.

A first planarization layer 160 is provided on the auxiliary electrode CE. In this case, a contact hole may be provided in the first planarization layer 160 so that a portion of the auxiliary electrode CE may be exposed.

Meanwhile, the embodiment of the present disclosure is not limited thereto. Unlike FIG. 4, when the auxiliary electrode CE is not formed, a portion of the source electrode SE may be exposed by the contact hole formed in the first planarization layer 160.

The first planarization layer 160 may be formed of an organic insulating layer material. The first planarization layer 160 may be made of, for example, an organic insulating material such as acrylic resin, epoxy resin, phenolic resin, polyamide resin, or polyimide resin.

A second planarization layer 170 may be formed on the first planarization layer 160. Since a contact hole is provided in the second planarization layer 170, a portion of the auxiliary electrode CE may be exposed.

The second planarization layer 170 may be formed of an organic insulating layer material. The second planarization layer 170 may be made of, for example, an organic insulating material such as acrylic resin, epoxy resin, phenolic resin, polyamide resin, or polyimide resin.

A first electrode E1 is formed on the second planarization layer 170 and is connected to the auxiliary electrode CE through the contact hole provided in the first planarization layer 160 and the second planarization layer 170. Furthermore, the first electrode E1 is connected to the source electrode SE of the thin film transistor TR through the auxiliary electrode CE. The first electrode E1 may function as an anode.

A bank layer 180 is provided to cover an edge of the first electrode E1 to define a light emitting area. Accordingly, an upper surface area of the first electrode E1 exposed without being covered by the bank layer 180 becomes a light emitting area.

The bank layer 180 may be formed of an organic layer such as an acrylic resin, an epoxy resin, a phenolic resin, a polyamide resin, or a polyimide resin.

A light emitting layer EL is provided on the first electrode E1. The emission layer EL may include red, green, and blue emission layers patterned for each pixel, or may be formed of a white emission layer connected to all pixels. When the emission layer EL is formed of a white emission layer, the emission layer EL may include, for example, a first stack including a blue emission layer, a second stack including a yellow green emission layer, and a charge generation layer provided between the first stack and the second stack, but is not limited thereto.

A second electrode E2 is provided on the light emitting layer EL. The second electrode E2 may function as a cathode.

An encapsulation layer Encap may be provided on the second electrode E2. According to an embodiment of the present disclosure, the encapsulation layer Encap includes a first encapsulation layer 190a, a second encapsulation layer 190b, and a third encapsulation layer 190c.

The encapsulation layer Encap may protect the light emitting layer EL and the second electrode E2 by blocking the penetration of external moisture or oxygen.

According to an embodiment of the present disclosure, the first encapsulation layer 190a and the third encapsulation layer 190c may be formed of an inorganic layer including an inorganic material, and the second encapsulation layer 190b may be formed of an organic layer including an organic material. Accordingly, the encapsulation layer Encap according to an embodiment of the present disclosure may be formed such that one organic layer is provided between two inorganic layers.

The first encapsulation layer 190a may be provided at the lowest layer of the encapsulation layer Encap. Accordingly, the first encapsulation layer 190a may be formed to be adjacent to the light emitting layer EL and the second electrode E2.

The first encapsulation layer 190a may be formed of a material such as silicon nitride SiNx, silicon oxide SiOx, silicon oxynitride SiON, or aluminum oxide Al2O3.

The second encapsulation layer 190b is formed on the first encapsulation layer 190a.

The second encapsulation layer 190b may be formed of a material such as acrylic resin, epoxy resin, polyimide, polyethylene PE, or silicon oxycarbon SiOC.

The second encapsulation layer 190b may be formed to have an area smaller than that of each of the first encapsulation layer 190a and the third encapsulation layer 190b. Specifically, as shown in FIG. 4, the second encapsulation layer 190b may be formed only at one end (side) of the first dam DAM1, for example, only the left end (side) of the drawing, while the first encapsulation layer 190a and the third encapsulation layer 190c may also be formed on the first dam DAM1 and the second dam DAM2 so as to be on another side (e.g., right end) of the first DAM1 and the second dam DAM2.

The third encapsulation layer 190c is formed on the second encapsulation layer 190b.

The third encapsulation layer 190c may be formed of the same material as the first encapsulation layer 190a.

A first dam DAM1 and a second dam DAM2 may be formed on the second interlayer insulating layer 150.

The first dam DAM1 and the second dam DAM2 may prevent or at least reduce the encapsulation layer Encap, particularly, the second encapsulation layer 190b made of an organic material from flowing outward in the non-display area NDA towards the touch pad electrode TPE.

The first dam DAM1 may include a first sub-dam DAM1a and a second sub-dam DAM1b.

According to an embodiment of the present disclosure, the second sub-dam DAM1b may be simultaneously formed in a process of pattern-forming the second planarization layer 170. Accordingly, the second sub-dam DAM1b may be made of the same material as the second planarization layer 170.

The first sub-dam DAM1a is provided on the second sub-dam DAM1b. The first sub-dam DAM1a may be simultaneously formed in a process of pattern-forming the bank layer 180. Accordingly, the first sub-dam DAM1a may be made of the same material as the bank layer 180.

The second dam DAM2 is located outside the display area A/A than the first dam DAM1.

According to an embodiment of the present disclosure, the second dam DAM2 may include a first sub-dam DAM2a and a second sub-dam DAM2b. The second sub-dam DAM2b may be simultaneously formed in a process of pattern-forming the second planarization layer 170. Accordingly, the second sub-dam DAM2b may be made of the same material as the second planarization layer 170.

The first sub-dam DAM2a is provided on the second sub-dam DAM2b. The first sub-dam DAM2a may be simultaneously formed in a process of pattern-forming the bank layer 180. Accordingly, the first sub-dam DAM2a may be made of the same material as the bank layer 180.

A touch buffer layer 200 may be formed on the encapsulation layer Encap. Furthermore, the touch buffer layer 200 may be formed on the entire surface of the substrate 110.

According to an embodiment of the present disclosure, the touch buffer layer 200 may be provided on the display area A/A and the non-display area NDA. The touch buffer layer 200 may be formed of an acrylic, epoxy, or siloxane-based material.

A touch insulating layer 210 may be formed on the touch buffer layer 200. The touch insulating layer 210 may be formed in the display area A/A and also in the non-display area NDA. According to an embodiment of the present disclosure, the touch insulating layer 210 may be formed on the encapsulation layer Encap, the first dam DAM1, and the second dam DAM2.

The touch insulating layer 210 may be formed of an organic material. When the touch insulating layer 210 is made of an organic material, the touch insulating layer 210 may be formed to be thicker than when the touch insulating layer 210 is made of an inorganic material. For example, when the touch insulating layer 210 includes an organic material, the touch insulating layer 210 may be formed to have a thickness of about 2 μm. However, the thickness of the touch insulating layer 210 is not limited thereto.

By forming the touch insulating layer 210 to a thickness d1 that is thicker than that of a touch insulating layer with the inorganic material, a parasitic capacitance between a plurality of touch electrodes TE and RE provided on the touch insulating layer 210 and the second electrode E2 provided under the touch insulating layer 210 may be reduced.

A plurality of first touch electrodes TE and a plurality of second touch electrodes RE may be formed on the touch insulating layer 210.

The plurality of first touch electrodes TE and the plurality of second touch electrodes RE may have a single layer or a multilayer structure formed of metal materials such as molybdenum Mo, silver Ag, titanium Ti, copper Cu, aluminum Al, titanium/aluminum/titanium Ti/Al/Ti, molybdenum/aluminum/molybdenum Mo/Al/Mo.

The plurality of first touch electrodes TE and the plurality of second touch electrodes RE may be formed in a mesh type. However, the present disclosure is not limited thereto, and the plurality of first touch electrodes TE and the plurality of second touch electrodes RE may be formed of rectangular electrodes formed of a transparent conductive material.

The plurality of second touch electrodes RE can be formed to be spaced apart from each other in a region where the plurality of first touch electrodes TE and the plurality of second touch electrodes RE intersect. In this case, each of the plurality of separated second touch electrodes RE may be electrically connected through the bridge electrode BE.

The bridge electrode BE may be provided between the touch buffer layer 200 and the touch insulating layer 210, and may be connected to the plurality of second touch electrodes RE through a contact hole provided in the touch insulating layer 210.

The plurality of second touch electrodes RE can extend from the display area A/A to the non-display area NDA through the second touch line RL.

Through the second touch line RL, the plurality of second touch electrodes RE may be electrically connected to a touch pad electrode TPE provided on the second interlayer insulating layer 150.

As the plurality of second touch electrodes RE are connected to the touch pad electrode TPE, a signal from the touch driver 380 may be received.

Figure 5:
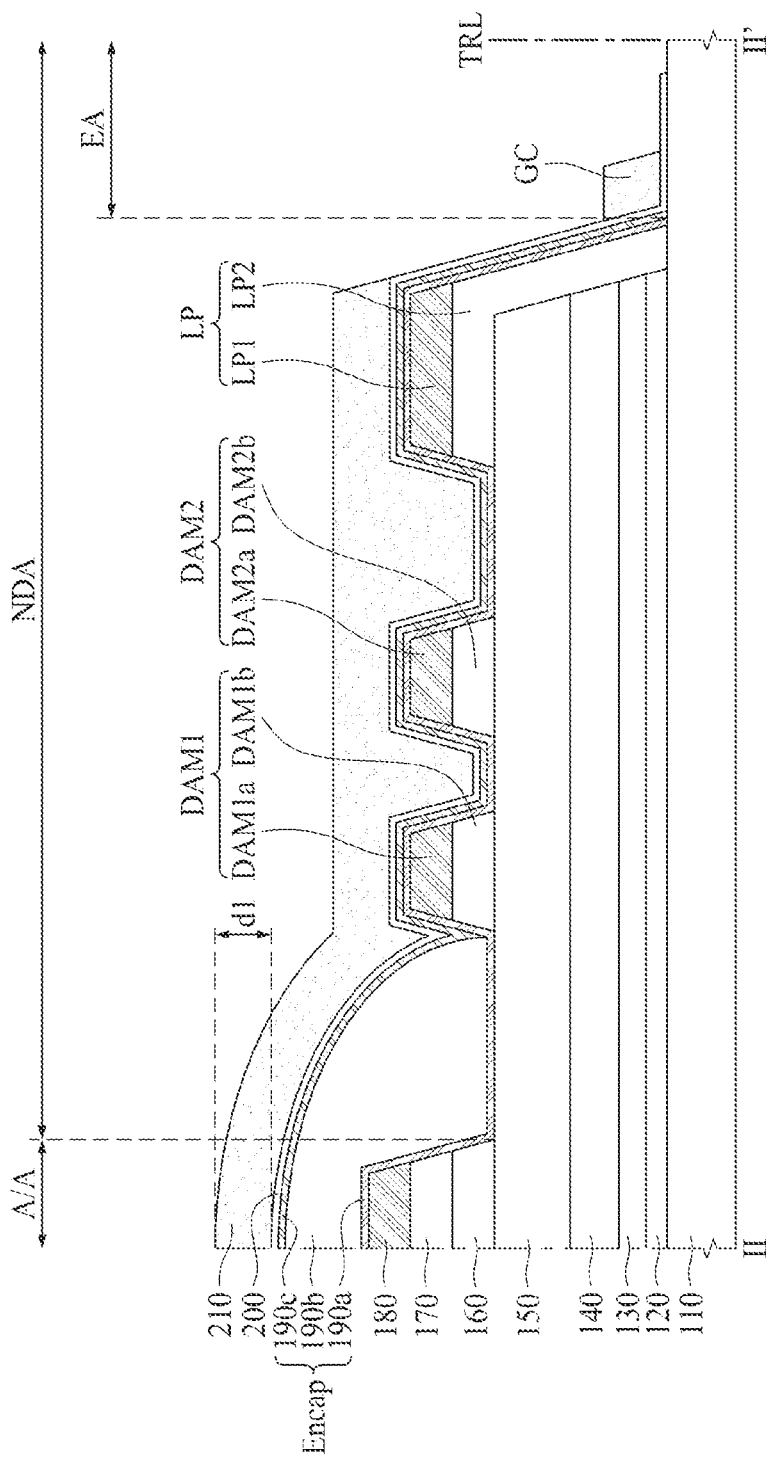
FIG. 5 is a cross-sectional view along II-II' of a display device integrated touch screen shown in FIG. 3 according to an embodiment of the present disclosure.

FIG. 5 is a cross-sectional view along line II-II' of a display device integrated touch screen shown in FIG. 3 according to an embodiment of the present disclosure.

According to an embodiment of the present disclosure, as shown in FIG. 5, the display device integrated touch screen includes a substrate 110, a buffer layer 120, a gate insulating layer 130, a first interlayer insulating layer 140, a second interlayer insulating layer 150, a first planarization layer 160, a second planarization layer 170, a bank layer 180, an encapsulation layer Encap, a touch buffer layer 200, a touch insulating layer, a first dam DAM1, a second dam DAM2, a layer protection part LP and a step adjustment layer GC. Meanwhile, since the configuration of the substrate 110, the buffer layer 120, the gate insulating layer 130, the first interlayer insulating layer 140, the second interlayer insulating layer 150, the first planarization layer 160, the second planarization layer 170, the bank layer 180, the encapsulation layer Encap, the touch buffer layer 200, the touch insulating layer 210, the first dam DAM1, and the second dam DAM2 is the same as that of the embodiment shown in FIG. 4, different configurations will be mainly described below.

According to an embodiment of the present disclosure, the buffer layer 120, the gate insulating layer 130, the first interlayer insulating layer 140, and the second interlayer insulating layer 150 extend from the display area A/A toward the non-display area NDA. One end, for example, the right end of the buffer layer 120, the gate insulating layer 130, the first interlayer insulating layer 140, and the second interlayer insulating layer 150 extend from the display area AA to the non-display area NDA.

According to an embodiment of the present disclosure, the layer protection part LP may be formed on the second interlayer insulating layer 150. Specifically, the layer protection part LP may be formed to cover one end of each of the buffer layer 120, the gate insulating layer 130, the first interlayer insulating layer 140, and the second interlayer insulating layer 150 to protect side surfaces of the buffer layer 120, the gate insulating layer 130, the first interlayer insulating layer 140 and the second interlayer insulating layer 150 from being exposed to the outside in the non-display area NDA. In one embodiment, the layer protection part LP has a first height from an uppermost surface of the layer protection part LP to the upper surface of the substrate 110. The layer protection part LP includes an inclined surface that extends from the upper most surface of the layer protection part LP towards the substrate 110. A portion of the inclined surface of the layer protection part LP overlaps the side surfaces of the buffer layer 120, the gate insulating layer 130, the first interlayer insulating layer 140 and the second interlayer insulating layer 150. The layer protection part LP may prevent moisture or oxygen from penetrating into the side surfaces of the buffer layer 120, the gate insulating layer 130, the first interlayer insulating layer 140, and the second interlayer insulating layer 150 due to being exposed in the non-display area NDA.

In one embodiment, the layer protection part LP includes a plurality of layers that are configured to cover the ends of a plurality of the layers in the non-display area NDA (e.g., the buffer layer 120, the gate insulating layer 130, etc.) According to an embodiment of the present disclosure, the layer protection part LP may include two layers including a first layer protection part LP1 and a second layer protection part LP2. In one embodiment, the first layer protection part LP1 may be formed in the same process as the bank layer 180 and the second layer protection part LP2 may formed the same process as the second planarization layer 170. Meanwhile, the layer protection part LP is not limited to two layers. Thus, the first layer protection part LP1 is made of a same material as the bank layer 180 and the second layer protection part LP2 is made of a same material as the second planarization layer 170.

The first encapsulation layer 190a, the third encapsulation layer 190c, the touch buffer layer 200, and the touch insulating layer 210 may be sequentially formed on the layer protection part LP. However, present disclosure is not limited thereto, and the first encapsulation layer 190a and the third encapsulation layer 190c may not be formed on the layer protection part LP.

A layer end area EA may be formed on one side, for example, the right side of the layer protection part LP. The layer end area EA may be defined as a region between trimming line TRL and an end of the layer protection part LP, for example, a right end in one embodiment. The layer end area EA is formed in the non-display area NDA. A plurality of organic or inorganic layers for example, the buffer layer 120, the gate insulating layer 130, the first interlayer insulating layer 140, the second interlayer insulating layer 150, the layer protection part LP, and the touch insulating layer 210, are deposited between the layer end area EA and the display area A/A, and may not be provided on the layer end area EA. Therefore, a step may occur between the end of the non-display area NDA (for example, the right end of the non-display area NDA) and the layer end area EA.

According to an embodiment of the present disclosure, the step adjustment layer GC may be provided in the layer end area EA. In one embodiment, a portion of the layer end area EA that includes the step adjustment layer GC is thicker than remaining portions of the layer end area EA that lack the step adjustment layer GC.

In one embodiment, the step adjustment layer GC is placed at the boundary between the layer end area EA and a remaining portion of the non-display area NDA that excludes the layer end area EA in one embodiment. In one embodiment, the step adjustment layer GC overlaps a portion of the inclined surface of the layer protection part LP. As shown in FIG. 5, a portion of the encapsulation layer Encap (e.g., 190a and 190c) is between the inclined portion of the layer protection part LP and the step adjustment layer GC.

The step adjustment layer GC has a second height from an uppermost surface of the step adjustment layer GC to the upper surface of the substrate 110. The second height of the step adjustment layer GC is less than the first height of the layer protection part LP thereby creating a smaller step between the step adjustment layer GC and the layer protection part LP. That is, by forming the step adjustment layer GC, the step between the layer end area EA and the organic or inorganic layers provided at one side, for example, the left side of the layer end area EA in the non-display area NDA may be reduced.

If there is no step adjustment layer GC, a larger step may be formed between the layer end area EA and the plurality of organic or inorganic layers provided at the left side of the layer end area EA in the non-display area NDA. When the step is formed to be large, a photoresist applied to the entire surface of the substrate 110 may flow down and be applied with a thickness that is thicker than that designed on the layer end area EA during a process of patterning the touch electrodes TE and RE on the touch insulating layer 210.

In this case, light may not be irradiated or not be irradiated by a target amount to the lower end of the photoresist thickly stacked in the layer end area EA. As a result, a portion of the photoresist may form a residual film in the layer end area EA, or a residual film of the touch electrode TE, RE may be formed in the layer end area EA by a residual film of the photoresist.

When the residual film of the photoresist remains in the layer end area EA, the residual film of the photoresist may be decomposed and a portion thereof may be scattered during a trimming process along the trimming line TRL, thereby increasing a defect rate of the display device integrated touch screen.

When the residual film of the touch electrodes TE, RE remain in the layer end area EA, the display device integrated touch screen may be affected by an electrostatic discharge ESD caused by residual film made of the conductive material.

Meanwhile, according to an embodiment of present disclosure, since the step adjustment layer GC is provided in the layer end area EA, the step between the layer end area EA and the plurality of organic or inorganic layers provided on the left side of the layer end area EA is reduced. Since the step is reduced, a phenomenon in which the photoresist flows down in the process of forming the touch electrodes TE and RE may be reduced.

As a result, since the flow of the photoresist is reduced, the residual film of the photoresist or the residual film of the touch electrodes TE and RE may not be formed in the layer end area EA.

The step adjustment layer GC may be formed in the same process as the process of forming the touch insulating layer 210. Thus, the step adjustment layer GC is made of a same material as the touch insulating layer 210 in one embodiment. According to an embodiment of the present disclosure, the step adjustment layer GC may be formed using a half-tone mask in a process of forming the touch insulating layer 210, and thus may be provided in the layer end area EA. Meanwhile, the method of forming the step adjustment layer GC is not limited thereto, and a pattern may be additionally formed.

The step adjustment layer GC may be formed to have a thickness d1 equal to that of the touch insulating layer 210 in the display area A/A. According to an embodiment of the present disclosure, the thickness of the step adjustment layer GC may be 0.3 μm or more and 1 μm or less. When the thickness of the step adjustment layer GC is less than 0.3 μm, the step in the layer end area EA is lowered, and thus the residual film of the photoresist or of the touch electrodes TE, RE may be formed. However, it is not limited thereto.

In accordance with an embodiment of present disclosure, one end of the step adjustment layer GC, for example, the right end, may be formed at a distance of 10 μm or more from the trimming line TRL. Thus, the end of the step adjustment layer GC closest to the trimming line TRL is spaced apart from the trimming line TRL. By being formed as described above, the step adjustment layer GC is not trimmed during a trimming process along the trimming line TRL so as not to scatter organic materials, thereby preventing a defect rate from being increased in the display device integrated touch screen.

Figure 6:
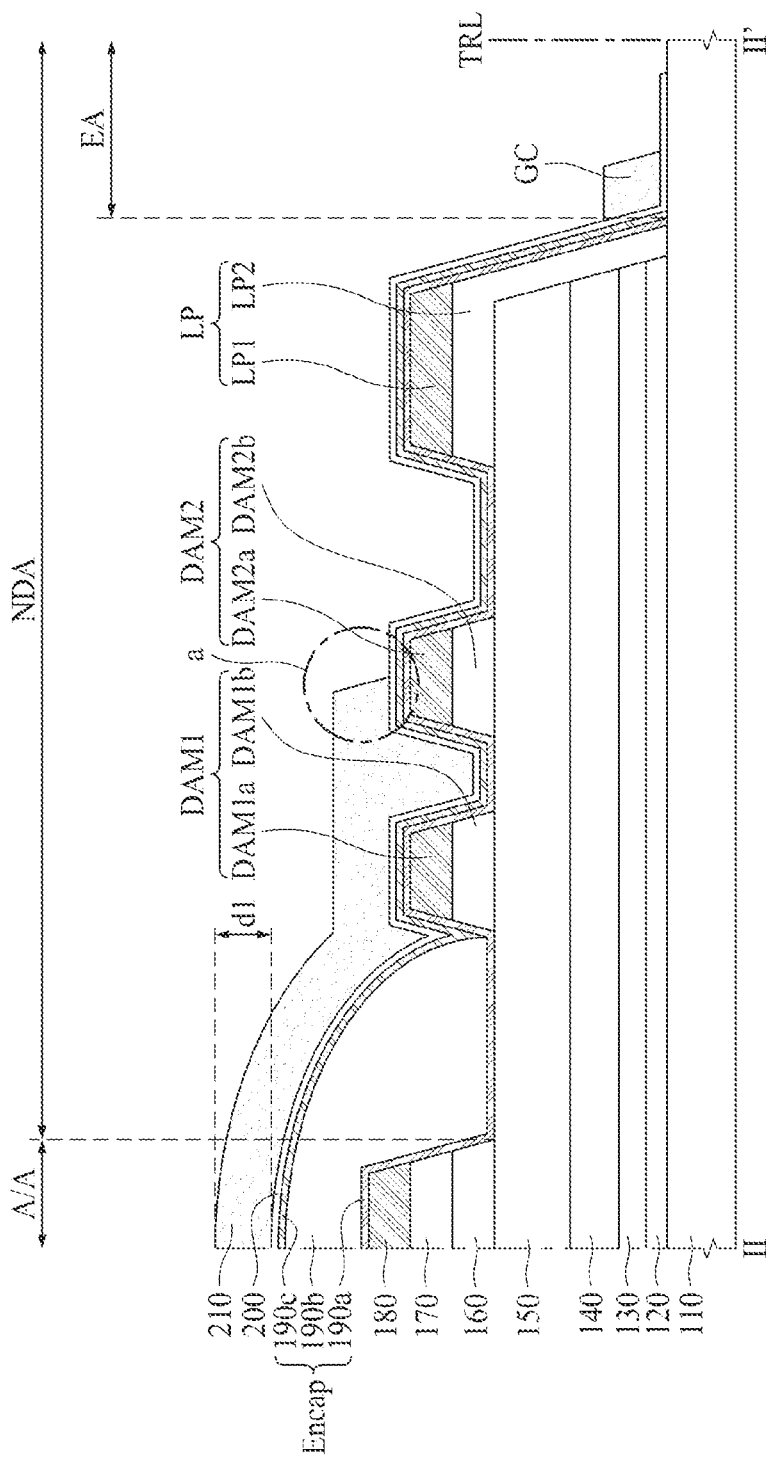
FIG. 6 is a cross-sectional view along II-II' of a display device integrated touch screen shown in FIG. 3 according to another embodiment of the present disclosure.

FIG. 6 is a cross-sectional view along line II-II' of a display device integrated touch screen shown in FIG. 3 according to another embodiment of the present disclosure. At this time, since the embodiment of FIG. 6 is the same as the embodiment of FIG. 5, except that one end of the touch insulating layer 210 is formed in the region a, different configurations will be mainly described below.

In accordance with an embodiment of present disclosure, one end of the touch insulating layer 210 can be provided on the upper surface of the second dam DAM2 as indicated by a dotted line in FIG. 6. Thus, the end of the touch insulating layer 210 in FIG. 6 is non-overlapping with the layer protection part LP in contrast to the embodiment of FIG. 5 where the end of the touch insulating layer 210 is overlapping with the layer protection part LP. Instead, the one end of the touch insulating layer 210 is provided on the upper surface of the second dam DAM2, thereby reducing a step between the layer end area EA and a plurality of organic or inorganic layers provided on the left side of the layer end area EA.

Since the step is reduced, the flow of the photoresist in the process of forming the touch electrodes TE and RE may be reduced.

As a result, since the flow of the photoresist is reduced, the residual film of the photoresist or the residual film of the touch electrodes TE and RE may not be formed in the layer end area EA.

By patterning a portion of the touch insulating layer 210 using a halftone mask, one end of the touch insulating layer 210 can be adjusted to be provided on the area a. For example, the touch insulating layer 210 may be formed from the display area A/A to a portion of the upper surface of the second dam DAM2, so that the one end of the touch insulating layer 210 may be located on the second dam DAM2 and overlap the second dam DAM2. Meanwhile, since a portion of the touch insulating layer 210 is patterned using a halftone mask, the touch insulating layer 210 may not be formed from the other portion of the upper surface of the second dam DAM2 to the layer protection part LP.

However, FIG. 6 illustrates that one end of the touch insulating layer 210 is provided on the upper surface of the second dam DAM2, but is not limited thereto. The one end of the touch insulating layer 210 may be provided on one side surface, for example, a right side surface of the first dam DAM1, or may be provided on one side surface, for example, a left side surface of the layer protection part LP.

Figure 7:
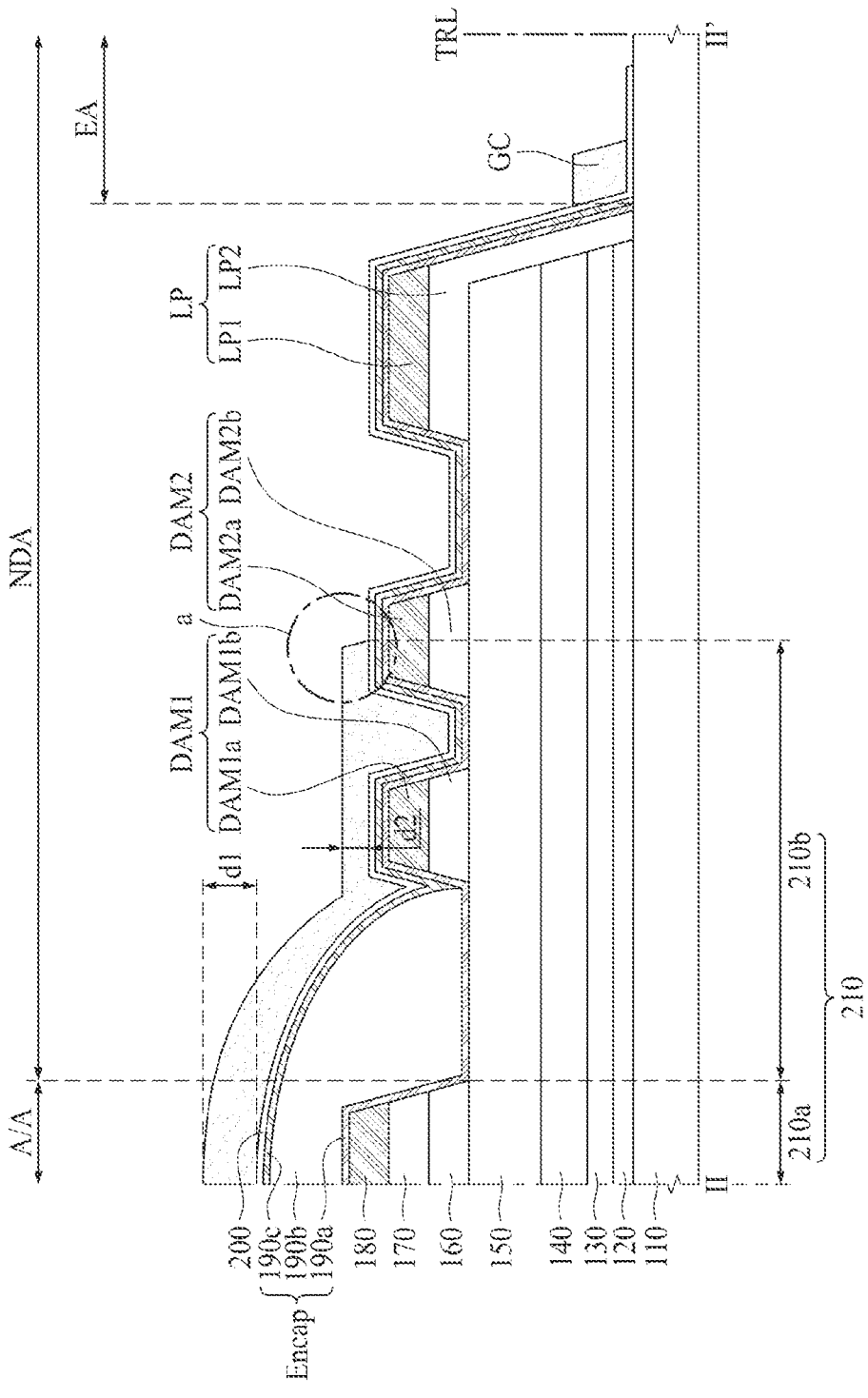
FIG. 7 is a cross-sectional view along II-II' of a display device integrated touch screen shown in FIG. 3 according to another embodiment of the present disclosure.

FIG. 7 is a cross-sectional view along of a display device integrated touch screen shown in FIG. 3 according to another embodiment of the present disclosure. In this case, since the embodiment of FIG. 7 is the same as the embodiment of FIG. 6, except that a portion of the touch insulating layer 210 is formed to be thinner than the touch insulating layer 210 in FIG. 6, different configurations will be described below.

In accordance with another embodiment of present disclosure, the touch insulating layer 210 may include a first touch insulating layer portion 210a in the display area A/A and a second touch insulating layer portion 210b in the non-display area NDA. As shown in FIG. 7, the second touch insulating layer portion 210b extends from the first touch insulating portion 210a. In this case, the first touch insulating layer portion 210a and the second touch insulating layer portion 210b may be formed by etching a portion of the touch insulating layer 210. In the process of etching the touch insulating layer 210, a half-tone mask may be used. The first dam DAM1 may be adjacent to the encapsulation layer Encap and the second dam DAM2 may be disposed between the first dam DAM1 and the layer protection part LP. The first touch insulating layer portion 210a may not overlap the first dam DAM1, the second dam DAM2, and the layer protection part LP, and the second touch insulating layer portion 210b may be disposed on the second dam DAM2, and the second touch insulating layer portion 210b may be not disposed on the layer protection part LP.

An unetched portion of the touch insulating layer 210 may be referred to as the first touch insulating layer portion 210a, and a partially etched portion of the touch insulating layer 210 may be referred to as the second touch insulating layer portion 210b. Accordingly, the first touch insulating layer portion 210a and the second touch insulating layer portion 210b may be provided on a same layer.

According to an embodiment of the present disclosure, the thickness of the first touch insulating layer portion 210a may be formed to have a first thickness d1, and the thickness of the second touch insulating layer portion 210b may be formed to have a second thickness d2 that is less than the first thickness d1.

The first touch insulating layer portion 210a may be formed over the entire display area A/A. Therefore, although not illustrated, a plurality of first touch electrodes TE or a plurality of second touch electrodes RE may be provided on the first touch insulating layer 210a. In addition, the first touch insulating layer portion 210a may overlap a plurality of thin film transistors TR provided in the display area A/A.

Meanwhile, the second touch insulating layer portion 210b may be provided in the non-display area NDA but not the display area A/A. Therefore, the plurality of first touch electrodes TE or the plurality of second touch electrodes RE are not provided on the second touch insulating layer 210b.

According to an embodiment of the present disclosure, the first thickness d1 may be formed to be greater than the second thickness d2. Specifically, in the process of forming the touch insulating layer portion 210, the touch insulating layer 210 may be further etched at the position of the area where the second touch insulating layer portion 210b is formed, except for the area where the first touch insulating layer portion 210a is formed. Accordingly, the thickness of the first touch insulating layer portion 210a may be adjusted to be greater than the thickness of the second touch insulating layer portion 210b.

Since the thickness d2 of the second touch insulating layer portion 210b is formed to be less than the thickness d1 of the first touch insulating layer portion 210a, the flow of the photoresist may be reduced in the process of forming the touch electrodes TE and RE on the touch insulating layer 210. Therefore, according to an embodiment of the present disclosure, a residual film of the photoresist or a residual film of the touch electrodes TE, RE may not be formed in the layer end area EA. As a result, since the flow of the photoresist is reduced, the residual film of the photoresist or the residual film of the touch electrodes TE and RE may not be formed in the layer end area EA.

Figure 8:
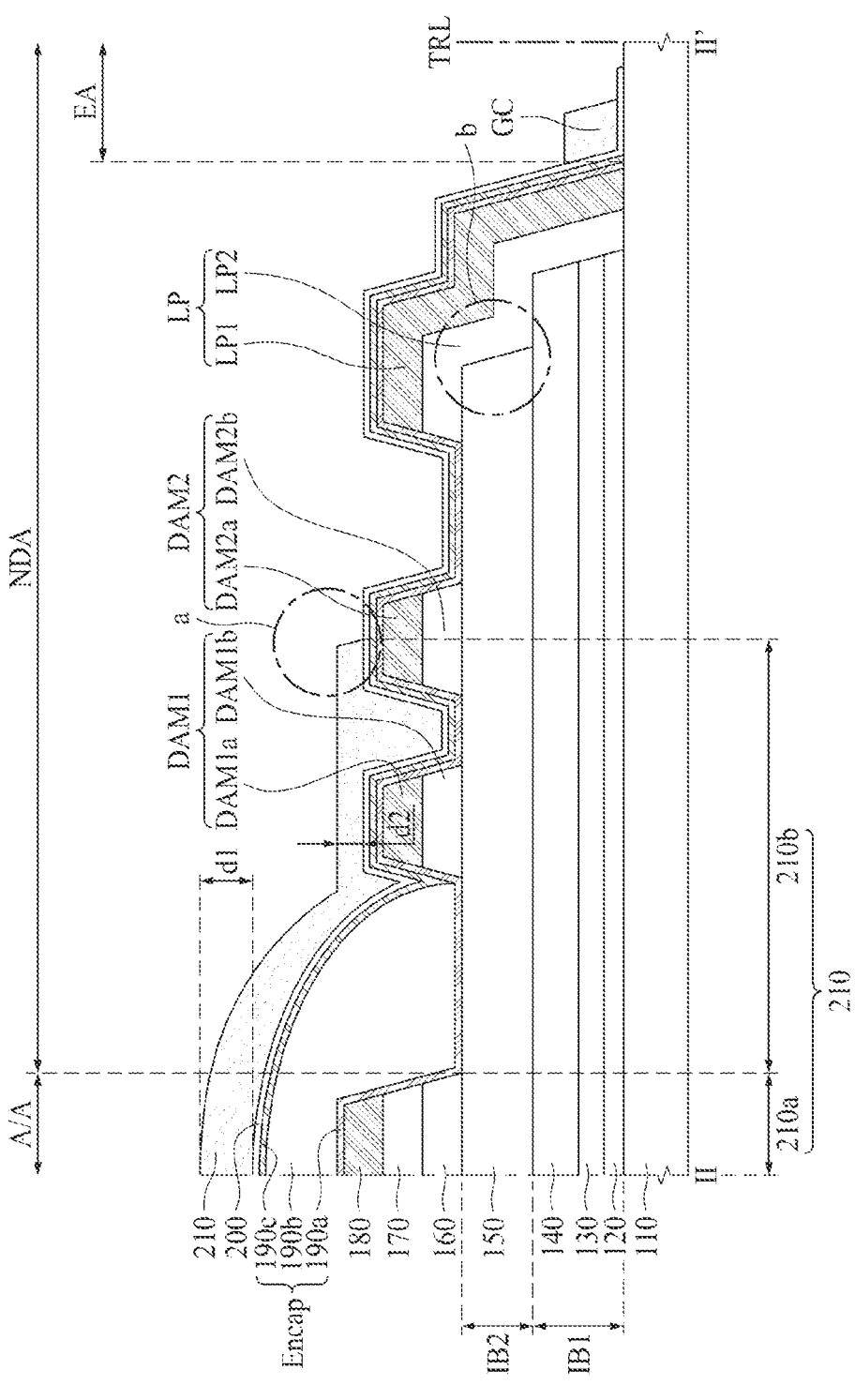
FIG. 8 is a cross-sectional view along II-II' of a display device integrated touch screen shown in FIG. 3 according to another embodiment of the present disclosure.

FIG. 8 is a cross-sectional view along line II-II' of a display device integrated touch screen shown in FIG. 3 according to another embodiment of the present disclosure. In this case, since the embodiment of FIG. 8 is the same as the embodiment of FIG. 7, except that one end of the first insulating layer IB1 and one end of the second insulating layer IB2 are formed to be spaced apart from each other in the region b compared to the other embodiments where the ends of the insulating layers are aligned, different configurations will be mainly described below.

According to another embodiment of the present disclosure, the display device integrated touch screen includes a first insulating layer IB1 and a second insulating layer IB2.

According to an embodiment of the present disclosure, the first insulating layer IB1 may include a plurality of insulating layers including the buffer layer 120, the gate insulating layer 130, and the first interlayer insulating layer 140. The second insulating layer IB2 may include the second interlayer insulating layer 150. Meanwhile, the configuration of the first insulating layer IB1 and the second insulating layer IB2 is not limited as described above, and the first insulating layer IB1 may include the buffer layer 120 and the gate insulating layer 130, and the second insulating layer IB2 may include the first interlayer insulating layer 140 and the second interlayer insulating layer 150. The step adjustment layer GC may not overlap the first insulating layer IB1 and the second insulating layer IB2. One end of the first insulating layer IB1 and one end of the second insulating layer IB2 may overlap the layer protection part LP.

The first insulating layer IB1 is provided on the substrate 110, and the second insulating layer IB2 is provided on the first insulating layer IB1. The layer protection part LP may cover side surfaces of the first insulating layer IB1 and the second insulating layer IB2.

According to an embodiment of the present disclosure, one end of the first insulating layer IB1, for example, a right end, may not match one end of the second insulating layer IB2. That is, the right end of the first insulating layer IB1 and the right end of the second insulating layer IB2 are misaligned. Specifically, as can be seen from the region b indicated by a dotted line in the drawing, the second insulating layer IB2 provided on the first insulating layer IB1 may be formed such that one end of the first insulating layer IB1 and one end of the second insulating layer IB2 are spaced apart from each other. That is, the second insulating layer IB2 is more inset than the first insulating layer IB1 such that the end of the second insulating layer IB2 is farther from the layer end area EA than the end of the first insulating layer IB1. As a result, a portion of the upper surface of the first insulating layer IB1 may be exposed.

Meanwhile, according to an embodiment of the present disclosure, a shortest distance between one end (e.g., right end) of the first insulating layer IB1 and one end (e.g., right end) of the second insulating layer IB2 is greater than or equal to 30 μm and less than or equal to 100 μm or less. This is because if the shortest distance between one end of the first insulating layer IB1 and one end of the second insulating layer IB2 is less than 30 μm, the effect of reducing the slope of one side surface of the layer protection part LP is reduced, and thus the photoresist residual layer may be formed on the layer end area EA. On the other hand, if the shortest distance between one end of the first insulating layer IB1 and one end of the second insulating layer IB2 exceeds 100 μm, the bezel size of the touch screen integrated display device according to the embodiment of present disclosure may become too large.

According to an embodiment of the present disclosure, the layer protection part LP may be formed in two steps. Specifically, since the layer protection part LP is provided on the first insulating layer IB1 and the second insulating layer IB2, the layer protection part LP may also be formed to be stepped by a step generated by separating the first insulating layer IB1 and the second insulating layer IB2.

Since the layer protection part LP is formed to be stepped into two steps, a slope of one side surface of the layer protection part LP, for example, a side surface adjacent to the layer end area EA, is reduced than a slope of one side surface when the layer protection part LP is not stepped.

According to an embodiment of the present disclosure, since the slope of one side surface of the layer protection part LP is gently formed, the flow of the photoresist may be reduced in the process of forming the plurality of touch electrodes TE and RE on the touch insulating layer 210.

As a result, since the flow of the photoresist is reduced, the residual film of the photoresist or the residual film of the touch electrodes TE and RE may not be formed in the layer end area EA.

Figure 9:
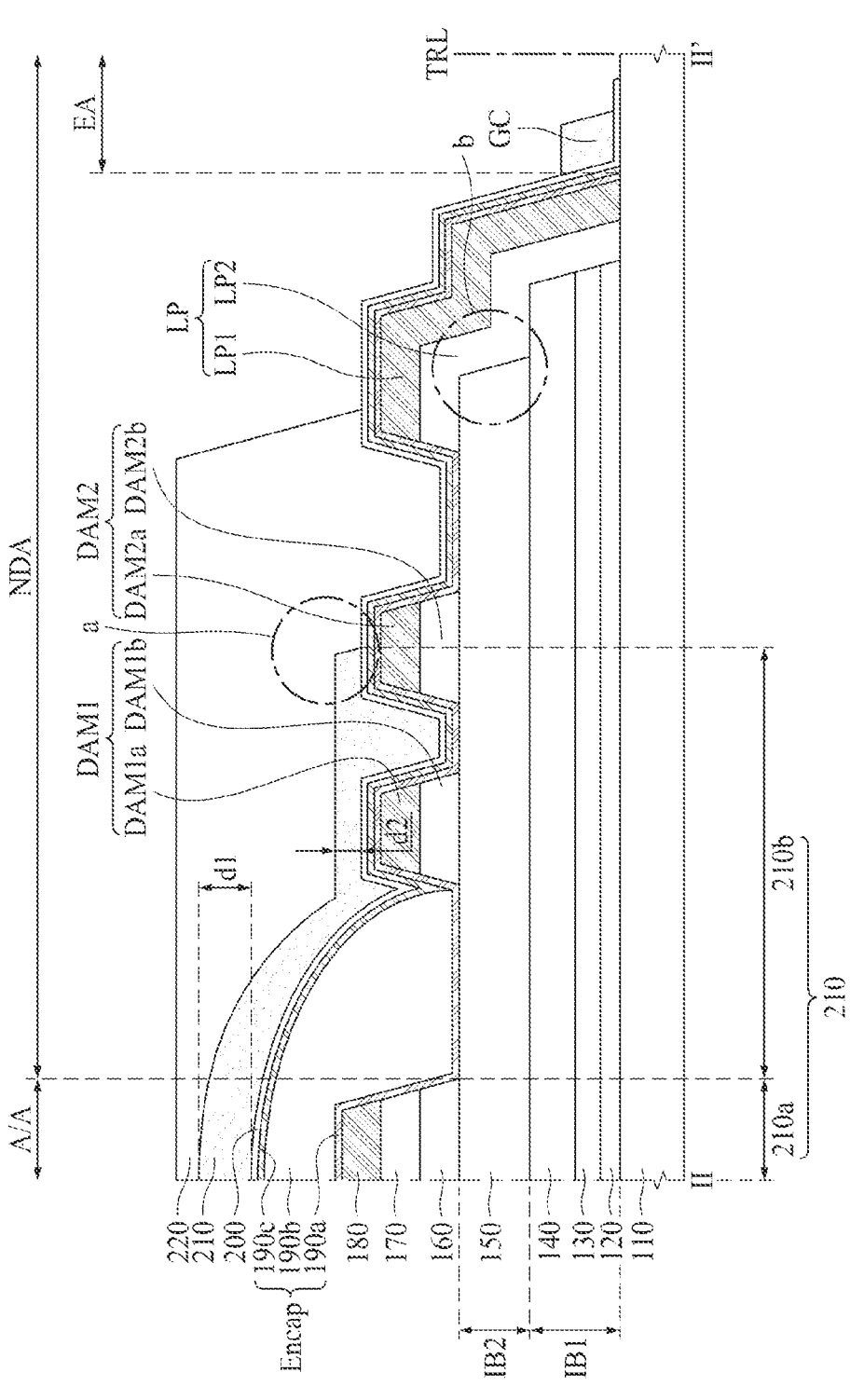
FIG. 9 is a cross-sectional view along II-II' of a display device integrated touch screen shown in FIG. 3 according to another embodiment of the present disclosure.

FIG. 9 is a cross-sectional view along line II-II' of a display device integrated touch screen shown in FIG. 3 according to another embodiment of the present disclosure. In this case, since the embodiment of FIG. 9 is the same as the embodiment of FIG. 8, except for the configuration of the cover layer 220, different configurations will be mainly described below.

According to an embodiment of the present disclosure, a cover layer 220 may be formed on the touch insulating layer 210.

The cover layer 220 may be formed to cover the display area A/A and may be formed to cover a portion of the non-display area NDA. According to an embodiment of the present disclosure, as shown in FIG. 9, the cover layer 220 may be formed to cover from the display area A/A to a portion of the upper surface of the layer protection part LP in the non-display area NDA.

The cover layer 220 may prevent or at least reduce external moisture from corroding the plurality of touch electrodes TE and RE provided under the cover layer 220.

The cover layer 220 may be formed of an organic insulating material, or may be formed in the form of a film made of a circular polarizing plate, an epoxy, or an acrylic material.

Accordingly, the present disclosure may have the following advantages.

According to an embodiment of the present disclosure, since a step adjustment layer is formed at one end or one side of the layer protection part provided outside the non-display area, the height between the upper surface of the layer protection part and the step adjustment layer is reduced by the thickness of the step adjustment layer, thereby reducing the flow of the photoresist in the process of forming the touch electrode. As a result, light is irradiated to all parts of the photoresist, so that the residual film of the photoresist may not remain after patterning process.

According to an embodiment of the present disclosure, by using a halftone mask in the process of forming a touch insulating layer including an organic film under the touch electrode, the touch insulating layer is formed between one side of the first dam and the layer protection part, thus controlling the flow of the photoresist. As a result, a residual film of photoresist can be prevented from remaining at one end of the layer protection part, and furthermore, a residual film of touch electrode may not remain at one end of the layer protection part, thereby reducing an effect of electrostatic discharge ESD.

According to an embodiment of the present disclosure, after forming the touch insulating layer, a portion of the touch insulating layer may be etched using a half-tone mask. In this case, the touch insulating layer may include a first touch insulating layer that is not etched and a second touch insulating layer formed by etching. Since the thickness of the second touch insulating layer is formed to be lower than that of the first touch insulating layer, the flow of photoresist in a process of forming a touch electrode may be alleviated.

According to an embodiment of the present disclosure, a plurality of inorganic layers formed to protect a plurality of thin film transistors may be provided under the encapsulation layer. In this case, the plurality of inorganic layers may include a first insulating layer and a second insulating layer. In accordance with the embodiment of present disclosure, one end of each of the first insulating layer and the second insulating layer provided on the first insulating layer can be separated to form a low side slope of the layer protection part, hence controlling the photoresist not to flow excessively on the layer protection part.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device with integrated touch screen comprising:
   a substrate;
   a first insulating layer on the substrate;
   a second insulating layer on the first insulating layer;
   a dam on the second insulating layer;
   a layer protection part overlapping an end of the second insulating layer and non-overlapping with the dam;
   an encapsulation layer on the second insulating layer;
   a touch electrode and a touch insulating layer on the encapsulation layer; and
   a step adjustment layer at one side of the layer protection part without the layer protection part between the step adjustment layer and the substrate.

2. The display device according to claim 1, wherein the step adjustment layer is non-overlapping with the first insulating layer and the second insulating layer, and the touch insulating layer and the step adjustment layer include a same organic material.

3. The display device according to claim 1, wherein a thickness of the step adjustment layer is greater than or equal to 0.3 μm and less than or equal to 1 μm.

4. The display device according to claim 1, wherein one end of the first insulating layer and one end of the second insulating layer are overlapped by the layer protection part, and the one end of the first insulating layer is misaligned with the one end of the second insulating layer.

5. The display device according to claim 4, wherein a distance between the one end of the first insulating layer and the one end of the second insulating layer is greater than or equal to 30 μm and less than or equal to 100 μm.

6. The display device according to claim 2, wherein one end of the touch insulating layer overlaps the dam.

7. The display device according to claim 2, wherein the touch insulating layer includes a first touch insulating layer portion having a first thickness and a second touch insulating layer portion having a second thickness that is less than the first thickness, the first touch insulating layer portion and the second touch insulating layer portion on a same layer.

8. The display device according to claim 7, wherein the dam comprises a first dam and a second dam that is closer to the layer protection part than the first dam, the second dam between the first dam and the layer protection part,
    wherein the first touch insulating layer portion is non-overlapping with the first dam, the second dam, and the layer protection part.

9. The display device according to claim 8, wherein the second touch insulating layer portion overlaps the second dam and is non-overlapping with the layer protection part.

10. A display device with integrated touch screen comprising:
    a substrate including a display area and a non-display area, the non-display area including a layer end area that includes an end of the substrate;
    a plurality of pixels and a plurality of touch electrodes in the display area;
    a touch line and a touch pad electrode in the non-display area, the touch line and the touch pad electrode electrically connected to the plurality of touch electrodes; and
    a step adjustment layer in a portion of the layer end area, wherein the portion of the layer end area including the step adjustment layer is thicker than remaining portions of the layer end area.

11. The display device according to claim 10, further comprising:
    an encapsulation layer in the display area; and
    a touch insulating layer on the encapsulation layer,
    wherein the plurality of touch electrodes and the plurality of touch line are on the touch insulating layer.

12. The display device according to claim 11, wherein the touch insulating layer includes a first touch insulating layer portion having a first thickness and a second touch insulating layer portion having a second thickness that is less than the first thickness, and the second touch insulating layer portion on a same layer as the first touch insulating layer portion,
    wherein the first touch insulating layer portion overlaps the display area but is non-overlapping with the non-display area, and the second touch insulating layer overlaps the non-display area but is non-overlapping with the display area.

13. The display device according to claim 10, further comprising:
    a first insulating layer on the substrate and a second insulating layer on the first insulating layer,
    wherein one end of the first insulating layer is misaligned with one end of the second insulating layer in the non-display area.

14. The display device according to claim 13, further comprising:
    a layer protection part on the second insulating layer in the non-display area, the layer protection part covering side surfaces of the first insulating layer and the second insulating layer.

15. A touch display device comprising:
    a substrate including a display area and a non-display area, the non-display area including a layer end area that includes an end of the substrate;
    a plurality of pixels and a plurality of touch electrodes on the display area;
    a plurality of insulating layers that extend from the display area to the non-display area without extending to the layer end area;
    a layer protection part covering side surfaces of the plurality of insulating layers in the non-display area, the layer protection part including an upper surface having a first height with respect to the substrate; and
    a step adjustment layer in a portion of the layer end area, an upper surface of the step adjustment layer having a second height with respect to the substrate that is less than the first height of the layer protection part.

16. The touch display device according to claim 15, wherein the layer protection part includes an inclined surface that overlaps the side surfaces of the plurality of insulating layers, and the step adjustment layer overlaps a portion of the inclined surface of the layer protection part.

17. The touch display device according to claim 16, further comprising:
    an encapsulation layer that extends from the display area to the non-display area, a portion of the encapsulation layer on the inclined surface of the layer protection part such that the portion of the encapsulation layer is between the step adjustment layer and the inclined portion of the layer protection part.

18. The touch display device according to claim 17, further comprising:
    a touch insulating layer between the encapsulation layer and the plurality of touch electrodes, wherein the step adjustment layer is made of a same material as the touch insulating layer.

19. The touch display device according to claim 18, wherein the touch insulating layer includes a first portion in the display area and a second portion that extends from the first portion to the non-display area, wherein a first thickness of the first portion is greater than a second thickness of the second portion.

20. The touch display device according to claim 15, wherein the plurality of insulating layers includes a first insulating layer and a second insulating layer, and an end of the second insulating layer is farther from the layer end area than an end of the first insulating layer.

* * * * *